(12) United States Patent
Nakatani et al.

(10) Patent No.: US 8,105,694 B2
(45) Date of Patent: Jan. 31, 2012

(54) POLYTETRAFLUOROETHYLENE AQUEOUS DISPERSION COMPOSITION, POLYTETRAFLUOROETHYLENE RESIN FILM AND POLYTETRAFLUOROETHYLENE RESIN IMPREGNATED ARTICLE

(75) Inventors: Yasukazu Nakatani, Settsu (JP); Toshirou Miura, Settsu (JP); Yasuhiko Sawada, Settsu (JP); Hiroshi Torii, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 202 days.

(21) Appl. No.: 11/908,200

(22) PCT Filed: Mar. 9, 2006

(86) PCT No.: PCT/JP2006/304628
§ 371 (c)(1),
(2), (4) Date: Sep. 10, 2007

(87) PCT Pub. No.: WO2006/095826
PCT Pub. Date: Sep. 14, 2006

(65) Prior Publication Data
US 2009/0035582 A1     Feb. 5, 2009

(30) Foreign Application Priority Data
Mar. 10, 2005 (JP) ................................ 2005-068106
May 27, 2005 (JP) ................................ 2005-156420

(51) Int. Cl.
*B32B 27/04* (2006.01)
*B32B 27/06* (2006.01)
*B32B 27/20* (2006.01)
*B32B 27/28* (2006.01)
*B32B 27/30* (2006.01)

(52) U.S. Cl. ........ 428/422; 428/323; 428/327; 428/421; 442/59; 442/155; 442/173; 525/191; 525/199; 525/203

(58) Field of Classification Search ................. None
See application file for complete search history.

(56) References Cited

U.S. PATENT DOCUMENTS

| | | | | | |
|---|---|---|---|---|---|
| 4,330,451 | A | * | 5/1982 | Straub et al. | 524/458 |
| 4,450,197 | A | * | 5/1984 | Hager et al. | 442/188 |
| 4,722,962 | A | * | 2/1988 | Shay et al. | 524/548 |
| 5,362,815 | A | * | 11/1994 | Shih et al. | 525/326.9 |
| 5,690,721 | A | * | 11/1997 | Itoh | 106/31.13 |
| 5,705,553 | A | * | 1/1998 | Kuropka | 524/459 |
| 5,705,867 | A | * | 1/1998 | Jeon | 310/68 C |
| 6,156,453 | A | | 12/2000 | Shimizu et al. | |
| 6,187,884 | B1 | * | 2/2001 | Kothrade et al. | 526/212 |
| 6,218,015 | B1 | * | 4/2001 | Allen et al. | 428/422 |
| 6,596,073 | B1 | * | 7/2003 | Nyssen et al. | 106/499 |
| 6,653,393 | B2 | * | 11/2003 | Ishii et al. | 524/546 |
| 6,660,798 | B1 | * | 12/2003 | Marchese et al. | 524/520 |
| 6,803,405 | B1 | * | 10/2004 | Schnell et al. | 524/524 |

(Continued)

FOREIGN PATENT DOCUMENTS
EP         0 821 423 A1     1/1998
(Continued)

*Primary Examiner* — Vivian Chen
(74) *Attorney, Agent, or Firm* — Sughrue Mion, PLLC

(57) ABSTRACT

The invention provides a PTFE-containing aqueous dispersion composition which is excellent in mechanical stability and scarcely allows the formation of agglomerates due to fibrillation of the PTFE resin during transportation or processing thereof. This invention is a polytetrafluoroethylene-containing aqueous dispersion composition comprising a polytetrafluoroethylene resin (A), a hydrocarbon-derived nonionic compound (B) and a water-soluble high-molecular compound (C) having no oxygen atom in the main chain thereof.

5 Claims, 1 Drawing Sheet

U.S. PATENT DOCUMENTS

| | | | |
|---|---|---|---|
| 7,067,574 B2 * | 6/2006 | Tomihashi et al. | 524/376 |
| 7,220,713 B2 * | 5/2007 | Patel et al. | 510/130 |
| 7,361,708 B2 * | 4/2008 | Tomihashi et al. | 524/544 |
| 7,824,450 B2 * | 11/2010 | Jordan et al. | 8/464 |
| 2002/0094738 A1 * | 7/2002 | Ishii et al. | 442/81 |

FOREIGN PATENT DOCUMENTS

| | | | |
|---|---|---|---|
| EP | 1 059 333 | * | 12/2000 |
| EP | 1 199 340 A2 | | 4/2002 |
| JP | 01-289896 | * | 11/1989 |
| JP | 1-289896 | | 11/1989 |
| JP | 08-339809 | | 12/1996 |
| JP | 8-339809 | | 12/1996 |
| JP | 11-116849 | * | 4/1999 |
| JP | 2000-198899 | * | 7/2000 |
| JP | 2002-173870 | * | 6/2002 |
| WO | WO 96/32751 | | 10/1996 |
| WO | WO 03/011991 | * | 2/2003 |
| WO | WO 03/106556 | * | 12/2003 |

* cited by examiner

POLYTETRAFLUOROETHYLENE AQUEOUS DISPERSION COMPOSITION, POLYTETRAFLUOROETHYLENE RESIN FILM AND POLYTETRAFLUOROETHYLENE RESIN IMPREGNATED ARTICLE

TECHNICAL FIELD

The present invention relates to a polytetrafluoroethylene-containing aqueous dispersion composition, a polytetrafluoroethylene resin film and a polytetrafluoroethylene resin-impregnated article.

BACKGROUND ART

Aqueous dispersion compositions containing a polytetrafluoroethylene [PTFE] resin have so far been used for producing impregnated articles, such as roofing materials for membrane structures, by impregnating glass fibers, carbon fibers, Kevlar fibers and the like therewith and, further, for forming films by applying them to articles to be coated, or substrates, followed by baking, in such application fields as high-frequency printed circuit boards, conveyor belts and packing materials.

The conventional PTFE resin-containing aqueous dispersion compositions have a problem in that when they undergo mechanical stresses, PTFE particles readily coagulate, possibly resulting in deteriorations in the quality of the compositions or films or impregnated articles obtained by using them. Thus, when such compositions are transported using a pump or the like, agglomerates may be formed in the compositions, possibly leading to pump inside or filter blocking. Further, on the occasion of application thereof to metal substrates or fibrous substrates using a doctor bar to form coatings uniform in thickness, agglomerates may be formed in the vicinity of the doctor bar and remain as foreign matters on the coatings. On the occasion of forming coatings on various substrates therefrom using a spray gun, agglomerates may be formed in the nozzle portion of the gun and adhere as foreign matters onto the coatings.

For improving such mechanical stability, a PTFE-containing aqueous dispersion composition has been proposed which contains polyethylene oxide or a water-soluble polyurethane-based associated type thickening agent or viscosity increasing agent as incorporated therein (cf. e.g. Patent Document 1: Japanese Kokai (Laid-open) Publication 2000-198899 (Claim 1, [0019])).

However, Patent Document 1 does not describe any PTFE-containing aqueous dispersion composition containing a water-soluble high-molecular compound other than polyethylene oxide or a water-soluble polyurethane-based associated type thickening agent as incorporated therein.

DISCLOSURE OF INVENTION

Problems which the Invention is to Solve

In view of the above-discussed state of the art, it is an object of the present invention to provide a PTFE-containing aqueous dispersion composition which is excellent in mechanical stability and scarcely allows the formation of agglomerates during transportation or processing thereof.

Means for Solving the Problems

The present invention is a polytetrafluoroethylene-containing aqueous dispersion composition comprising a polytetrafluoroethylene resin (A), a hydrocarbon-derived nonionic compound (B) and a water-soluble high-molecular compound (C) having no oxygen atom in the main chain thereof.

The present invention is a polytetrafluoroethylene resin film obtained by applying the above-mentioned polytetrafluoroethylene-containing aqueous dispersion composition to an article to be coated.

The present invention is a polytetrafluoroethylene resin-impregnated article comprising an article to be impregnated and a coat film obtained by impregnating the article to be impregnated with the above-mentioned polytetrafluoroethylene-containing aqueous dispersion composition.

In the following, the invention is described in detail.

The polytetrafluoroethylene [PTFE]-containing aqueous dispersion composition of the invention comprises a PTFE resin (A), a hydrocarbon-derived nonionic compound (B) and a water-soluble high-molecular compound (C) having no oxygen atom in the main chain thereof (hereinafter such "water-soluble high-molecular compound (C) having no oxygen atom in the main chain thereof" is sometimes referred to as "water-soluble high-molecular compound (C)" for short).

The PTFE-containing aqueous dispersion composition of the invention is suited for use as a coating composition, although the field of application thereof is not limited thereto. When it is used as a coating composition, the PTFE-containing aqueous dispersion composition of the invention is applied to an article to be coated or an article to be impregnated therewith is impregnated in the composition, whereby a PTFE resin (A)-based coat layer can be formed on the article to be coated or on the surface of the article to be impregnated therewith. The term "substrate" is sometimes used herein to include, within the meaning thereof, both the article to be coated and the article to be impregnated. The terms "application (coating)" and "impregnation" each refers to a procedure comprising applying the PTFE-containing aqueous dispersion composition of the invention to an article to be coated or immersing an article to be impregnated therewith in the above composition (the term "application" is sometimes used herein to include, within the meaning thereof, application (coating) and immersion), followed by drying by heating, for instance, according to need, and further followed by baking at a temperature not lower than the melting point of the PTFE resin (A).

The PTFE-containing aqueous dispersion composition of the invention is excellent in mechanical stability and very scarcely allows the formation of agglomerates, which tend to appear on the doctor bar or spray gun nozzle, among others, during transfer using a pump or the like or on the occasion of forming coatings on various substrates.

The PTFE-containing aqueous dispersion composition of the invention comprises a PTFE resin (A).

In the PTFE-containing aqueous dispersion composition of the invention, the PTFE resin (A) constitutes PTFE resin (A) particles. The PTFE resin (A) particles are dispersed in an aqueous medium, which will be described later herein, in the PTFE-containing aqueous dispersion composition of the invention.

The "PTFE resin (A)" so referred to herein is a resin comprising a tetrafluoroethylene [TFE] homopolymer and/or a modification of polytetrafluoroethylene [modified PTFE].

The modified PTFE is a copolymer of TFE and a very small proportion of a monomer copolymerizable with TFE. The polymer to be used in a very small proportion is, for example, a fluoroolefin, a fluorinated alkyl vinyl ether, a fluorinated cyclic monomer or a perfluoroalkylethylene.

The fluorinated alkyl vinyl ether is, for example, a perfluoro(alkyl vinyl ether) [PAVE] and, as the PAVE, there may be mentioned, for example, perfluoro(methyl vinyl ether) [PMVE], perfluoro(ethyl vinyl ether) [PEVE] and perfluoro(propyl vinyl ether) [PPVE], among others.

The monomer unit content resulting from the monomer used in a very small proportion is preferably within the range of 0.001 to 2% by mass, more preferably within the range of 0.01 to 1% by mass, on the whole modified PTFE polymer chain basis. So long as the very small proportion monomer unit content is within the above range, the copolymer produces an effect such that it can provide processed goods or articles having at least one particular property that cannot be acquired with TFE homopolymers although it is generally characterized by its being not melt-moldable. Mention may be made of transparency of processed articles as the particular property.

The very small proportion monomer unit content, so referred to herein, is the value obtained by subjecting the PTFE-containing aqueous dispersion or PTFE-containing aqueous dispersion composition to coagulation, washing and drying and subjecting the thus-obtained powder to infrared absorption spectrometry.

In the present specification, the "monomer unit", for example the very small proportion monomer unit, means that moiety derived from the corresponding monomer which constitutes a part of the molecular structure of the modified PTFE. For example, the PPVE unit is that moiety derived from PPVE which constitutes a part of the molecular structure of the corresponding modified PTFE and is represented by —[CF$_2$—CF(—O—C$_3$F$_7$)]—.

The above-mentioned PTFE resin (A) preferably has a number average molecular weight of 1,000,000 to 20,000,000, more preferably 1,500,000 to 15,000,000.

When the number average molecular weight is lower than 1,000,000, the coatings obtained tend to be brittle and, when it is higher than 20,000,000, excessively high melt viscosities will result, so that particles will tend to be hardly fused together.

The number average molecular weight, so referred to herein, can be determined by measurement according to the method described in Journal of Applied Polymer Science, Vol. 17, pp. 3253-3257 (1973).

In the PTFE-containing aqueous dispersion composition of the invention, the PTFE resin (A) particles preferably have an average particle diameter of 200 to 500 nm. A more preferred lower limit to the average particle diameter is 220 nm, and a more preferred upper limit thereto is 400 nm. When the average particle diameter is not smaller than 200 nm, marked increases in film-forming ability are achieved but, when it is greater than 500 nm, the sedimentation of particles may readily occur, hence the stability of the aqueous dispersion composition will decrease.

The average particle diameter, so referred to herein, is the value determined in the following manner. A working curve is constructed which shows the relation between the transmittance of incident light rays having a wavelength of 550 nm per unit length of the PTFE-containing aqueous dispersion composition or PTFE-containing aqueous dispersion adjusted to a solid matter concentration of 0.22% by mass and the average particle diameter determined by particle diameter measurements in a certain specific direction on a transmission electron photomicrograph, and the average particle diameter of a sample is determined, using the working curve, from the transmittance as measured in the above manner.

The PTFE-containing aqueous dispersion composition of the invention preferably has a PTFE resin (A) content of 30 to 70% by mass based on the PTFE-containing aqueous dispersion composition. When the content is lower than 30% by mass, a large number of repetitions of the coating or impregnation procedure may be required in certain instances and, when it is above 70% by mass, high levels of viscosity will result, rendering the handling difficult in certain cases.

A more preferred lower limit to the PTFE resin (A) concentration is 40% by mass of the PTFE-containing aqueous dispersion composition, and a more preferred upper limit thereto is 65% by mass of the PTFE-containing aqueous dispersion composition.

The PTFE resin (A) concentration, so referred to herein, is the proportion determined in terms of percentage of the mass of the residue obtained by drying 10 g of the PTFE-containing aqueous dispersion composition at a temperature of 380° C. for 45 minutes to the mass of the PTFE-containing aqueous dispersion composition before drying.

The PTFE resin (A) can be supplied in the form of a PTFE-containing aqueous dispersion obtained by polymerizing TFE or TFE and such the very small proportion monomer mentioned above by any of the conventional methods of polymerization, for example emulsion polymerization or suspension polymerization, in the presence of an aqueous medium.

The above-mentioned polymerization is preferably carried out in the manner of emulsion polymerization.

The aqueous medium to be used in the above polymerization is, for example, water or a mixture composed of water and a known water-soluble solvent.

The polymerization can be carried out under conditions properly selected according to the kind and amount of the PTFE resin (A) to be used and to the emulsifier species, among others.

The PTFE-containing aqueous dispersion composition of the invention contains, in addition to the above-mentioned PTFE resin (A), a hydrocarbon-derived nonionic compound (B) and a water-soluble high-molecular compound (C) as well.

Presumably, the PTFE-containing aqueous dispersion composition of the invention is protected against mechanical stresses by the hydrocarbon-derived nonionic compound (B) and the water-soluble high-molecular compound having no oxygen atom in the main chain thereof (C) and, accordingly, the formation of agglomerates is inhibited.

Preferred as the hydrocarbon-derived nonionic compound (B) in the PTFE-containing aqueous dispersion composition of the invention are, for example, polyoxyalkylene alkyl ethers represented by the formula (I):

$$R—O—A^1-H \qquad (I)$$

wherein R is a straight or branched alkyl group containing 8 to 19, preferably 10 to 16, carbon atoms and A$^1$ is a polyoxyalkylene chain containing 8 to 58 carbon atoms, and polyoxyalkylene alkylphenyl ethers represented by the formula (II):

$$R—C_6H_4—O—A^1-H \qquad (II)$$

wherein R is a straight or branched alkyl group containing 2 to 13, preferably 4 to 12, carbon atoms and A$^1$ is a polyoxyalkylene chain containing 8 to 58 carbon atoms.

Preferred as the chain A$^1$ are polyoxyalkylene chains containing 4 to 20 oxyethylene units and 0 to 6 oxypropylene units.

Only one or both of a polyoxyalkylene alkyl ether represented by the above formula (I) and a polyoxyalkylene alkylphenyl ether represented by the above formula (II) may be used as the hydrocarbon-derived nonionic compound (B). The polyoxyalkylene alkyl ether represented by the formula (I) and the polyoxyalkylene alkylphenyl ether represented by the formula (II) each may comprise one single species or two or more species.

The polyoxyalkylene alkyl ether to be used may suitably comprise a polyoxyethylene alkyl ether represented by the formula (III):

$$C_xH_{2x+1}CH(C_yH_{2y+1})C_zH_{2z}O(C_2H_4O)_nH \qquad (III)$$

wherein x is an integer not smaller than 1, y is an integer not smaller than 1 and z is an integer of 0 or not smaller than 1 provided that x, y and z should satisfy the relation x+y+z=7 to 18, and n is an integer of 4 to 20, and/or a polyoxyalkylene alkyl ether represented by the formula (IV):

$$C_pH_{2p+1}\text{—}O\text{-}A^2\text{-}H \qquad (IV)$$

wherein p is an integer of 8 to 19 and $A^2$ is a polyoxyalkylene chain containing 13 to 46 carbon atoms.

The chain $A^2$ in the above formula (IV) is preferably a polyoxyalkylene chain comprising 4 to 20 oxyethylene units and 0 to 6 oxypropylene units.

Suited for use as the polyoxyalkylene alkylphenyl ether mentioned above are polyoxyalkylene alkylphenyl ethers represented by the formula (V):

$$C_qH_{2q+1}\text{—}C_6H_4\text{—}O\text{-}A^3\text{-}H \qquad (V)$$

wherein q is an integer of 2 to 13, preferably 4 to 12, and $A^3$ is a polyoxyalkylene chain comprising 4 to 20 oxyethylene units and 0 to 6 oxypropylene units.

From the viewpoint of the film-forming ability of the aqueous dispersion composition to be obtained, the hydrocarbon-derived nonionic compound (B) is preferably one which begins to decompose at about 150° C. and, upon about 5 minutes of heating within a temperature range of 350 to 400° C., gives 1 to 10% by mass, as compared with the mass before heating, of a residue.

The hydrocarbon-derived nonionic compound (B) preferably has an average HLB within the range of 10 to 16, more preferably within the range of 11 to 15.

The HLB, so referred to herein, is the value calculated according to Griffin's formula.

In PTFE-containing aqueous dispersion composition of the invention, the hydrocarbon-derived nonionic compound (B) preferably accounts for 2 to 12 parts by mass relative to 100 parts by mass of the PTFE resin (A). When the amount of the hydrocarbon-derived nonionic compound (B) is smaller than 2 parts by mass relative to 100 parts by mass of the PTFE resin (A), the stability of the composition may sometimes be impaired and, when it is larger than 12 parts by mass relative to 100 parts by mass of the PTFE resin (A), the physical properties of the PTFE coatings obtained by using the PTFE-containing aqueous dispersion composition may sometimes deteriorate, for example the coatings may be discolored.

A more preferred lower limit to the content of the hydrocarbon-derived nonionic compound (B) is 3 parts by mass, and a still more preferred lower limit thereto is 4 parts by mass, per 100 parts by mass of the PTFE resin (A). A more preferred upper limit thereto is 10 parts by mass on the same basis.

The water-soluble high-molecular compound (C) in the PTFE-containing aqueous dispersion composition of the invention is a water-soluble high-molecular compound having no oxygen atom in the main chain thereof. The water-soluble high-molecular compound (C) is preferably one having a molecular weight falling within a certain range and having a small side chain(s).

The water-soluble high-molecular compound (C) having no oxygen atom in the main chain thereof is susceptible to an electrolyte(s) contained in the composition and/or the temperature of the composition. For example, when the composition contains a large amount of an electrolyte component, the viscosity may increase and the PTFE resin (A) cannot be satisfactorily prevented from forming agglomerates in certain instances. The water-soluble high-molecular compound (C) is preferably used in the form of an aqueous dispersion prepared in advance.

The water-soluble high-molecular compound (C) having no oxygen atom in the main chain thereof preferably comprises at least one member selected from the group consisting of polyacrylic acid, polyacrylic acid derivatives, polyvinylpyrrolidone, poly(vinyl methyl ether) and poly(vinyl alcohol), among others. The compounds or compound group, such as polyacrylic acid, constituting the group mentioned above each may comprise one single species or two or more (sub)species.

As the above-mentioned polyacrylic acid derivatives, there may be mentioned polyacrylic acid salts, polyacrylamide and/or polyacrylic acid esters, among others. As for the "polyacrylic acid salts, polyacrylamide and/or polyacrylic acid esters" mentioned above, one single species or two or more species among the three species may be used, and each species may comprise one single subspecies or two or more subspecies.

The above-mentioned polyacrylic acid salts are not particularly restricted but include, among others, salts formed from polyacrylic acid and monovalent cations. As the monovalent cations, there may be mentioned, for example, $Li^+$, $Na^+$, $K^+$ and $NH_4^+$. Among these, $Na^+$ and $NH_4^+$ are preferred. The "polyacrylic acid salts" so referred to herein include those in partly or wholly dissociated form in the PTFE-containing aqueous dispersion composition of the invention.

The above-mentioned polyacrylic acid esters are not particularly restricted but include, for example, polyacrylic acid alkyl esters, and the alkyl moiety in the polyacrylic acid alkyl esters is, for example, preferably an alkyl group containing 1 to 5 carbon atoms, more preferably an alkyl group containing 1 to 3 carbon atoms.

Preferred as the polyacrylic acid derivatives in the practice of the invention are polyacrylic acid salts and polyacrylamide, among others.

The above-mentioned polyacrylic acid and derivatives thereof preferably have an average molecular weight of 10,000 to 20,000,000. The higher the average molecular weight is, the more improved the mechanical stability is. However, an extremely high average molecular weight causes an increase in the viscosity of the aqueous dispersion and makes the aqueous dispersion difficult to handle in certain instances. A more preferred lower limit is 20,000 and a more preferred upper limit is 10,000,000.

The above-mentioned polyvinylpyrrolidone preferably has an average molecular weight of 10,000 to 20,000,000. The higher the average molecular weight is, the more improved the mechanical stability is. However, an extremely high average molecular weight causes an increase in the viscosity of the aqueous dispersion and makes the aqueous dispersion difficult to handle in certain instances. A more preferred lower limit is 20,000 and a more preferred upper limit is 10,000,000.

The above-mentioned poly(vinyl methyl ether) preferably has an average molecular weight of 10,000 to 20,000,000. The higher the average molecular weight is, the more improved the mechanical stability is. However, an extremely high average molecular weight causes an increase in the viscosity of the aqueous dispersion and makes the aqueous dispersion difficult to handle in certain instances. A more preferred lower limit is 20,000 and a more preferred upper limit is 10,000,000.

The above-mentioned poly(vinyl alcohol) preferably has a degree of polymerization of 300 to 6000. The higher the degree of polymerization is, the higher the molecular weight is and the more improved the mechanical stability is. However, an extremely high degree of polymerization causes an increase in the viscosity of the aqueous dispersion and makes the aqueous dispersion difficult to handle in certain instances. A more preferred lower limit is 500 and a more preferred upper limit is 5000.

The above-mentioned poly(vinyl alcohol) preferably has a degree of hydrolysis of 70 to 99 mole percent. Within this range, the higher the degree of hydrolysis is, the lower the solubility in water is, and the lower the degree of hydrolysis is, the higher the solubility in water is. For preparing stable aqueous dispersion compositions, the above range is appropriate. A more preferred lower limit is 75 mole percent, and a more preferred upper limit is 98 mole percent, still more preferably 95 mole percent.

In the PTFE-containing aqueous dispersion composition of the invention, the content of the water-soluble high-molecular compound (C) is preferably 0.00001 to 1 part by mass per 100 parts by mass of the PTFE resin (A). When that content is lower than 0.00001 part by mass per 100 parts by mass of the PTFE resin (A), the mechanical stability may become insufficient and, when it is above 1 part by mass per 100 parts by mass of the PTFE resin (A), the viscosity of the composition will become high, possibly making the composition difficult to handle. A more preferred lower limit is 0.0001 part by mass per 100 parts by mass of the PTFE resin (A).

The contents of the hydrocarbon-derived nonionic compound (B) and water-soluble high-molecular compound (C), so referred to herein, can be determined each as the mass per 100 parts by mass of the PTFE resin (A) from the concentration of the PTFE resin (A) and the amount of (B) or (C) used on the occasion of preparing the PTFE-containing aqueous dispersion composition of the invention (inclusive of the amount thereof used on the occasion of preparing the PTFE-containing aqueous dispersion, if incorporated on that occasion).

In the PTFE-containing aqueous dispersion composition of the invention, there may be incorporated one or more of various known additives each at a level at which the effects of the present invention will not be sacrificed. As such additives, there may be mentioned, for example, pigments, fillers, antifoaming agents, drying retarders, film-forming agents, leveling agents, anticissing agents and film-forming auxiliaries, among others.

The pigments are not particularly restricted but include, among others, titanium oxide, carbon black, red iron oxide and other known pigments.

The fillers are not particularly restricted but include those known in the art.

As the antifoaming agents, there may be mentioned, for example, nonpolar solvents such as toluene, xylene and hydrocarbons containing 9 to 11 carbon atoms. Further, commercial silicone type compound emulsions or silicone emulsion (silica-octamethylcyclotetrasiloxane emulsion) type antifoaming agents may also be added. As the silicone emulsion type antifoaming agents, there may be mentioned, for example, SN Defoamer 382 (product of San Nopco Limited), FS Antifoam 013A (product of Dow Corning Asia Ltd.) and FS Antifoam 1277 (product of Dow Corning Asia, Ltd.), among others. These are preferably added to the PTFE-containing aqueous dispersion composition of the invention at addition levels of 0.01 to 1% by mass and are preferably added just before processing such as coating.

As the drying retarders, there may be mentioned, for example, solvents having a boiling point of about 200 to 300° C. Preferred as such solvents are aqueous solvents.

As the film-forming agents, there may be mentioned, for example, acrylic resins and the like.

As the leveling agents or anticissing agents, there may be mentioned, for example, fluorinated surfactants and silicone type surfactants, among others.

The PTFE-containing aqueous dispersion composition of the invention is preferably one having a viscosity at 25° C. of not higher than 0.1 Pa·s. An excessively high viscosity may make the composition difficult to handle.

A more preferred upper limit is 0.06 Pa·s and, so long as the viscosity is within such range, it may be not lower than 0.01 Pa·s.

The viscosity so referred to herein is determined at a temperature of 25° C. according to JIS K 6893 using a type B rotational viscometer (product of Tokyo Keiki Co., Ltd.).

The PTFE-containing aqueous dispersion composition of the invention can be prepared, for example, by adding the hydrocarbon-derived nonionic compound (B) and water-soluble high-molecular compound (C), if desired together with another additive or additives, to the PTFE-containing aqueous dispersion as obtained by polymerization with stirring, followed by mixing up, although the method of preparation is not limited to such procedure.

In the above preparation procedure, the hydrocarbon-derived nonionic compound (B) can also be added on the occasion of preparing the PTFE-containing aqueous dispersion; for example, it may be added in lieu of the dispersing agent conventionally used on the occasion of concentrating the polymerization product in the form of an aqueous dispersion. Generally, it is preferred that it be added after preparation of the PTFE-containing aqueous dispersion to adjust the viscosity of the desired PTFE-containing aqueous dispersion composition.

The conditions under which the above-mentioned stirring, adding and mixing operations are to be carried out can be properly selected according to the composition and amount of the composition to be used; preferably, however, the operations are carried out at a temperature of 5 to 30° C.

The PTFE-containing aqueous dispersion composition of the invention, which has the constitution described above, is excellent in mechanical stability, as described hereinabove.

The mechanical stability, so referred to herein, is evaluated in the following manner. A 100-ml portion of the PTFE-containing aqueous dispersion composition to be tested is maintained at 35° C. and circulated using a diaphragm pump equipped with a poly(vinyl chloride) tube with an inside diameter of 8 mm and an outside diameter of 11 mm at a rate of 1500 ml/minute for 20 minutes and then filtered through a 200-mesh SUS stainless steel screen. The oversize fraction is measured, and the proportion (% by mass) thereof to the PTFE resin (A) contained in the PTFE-containing aqueous dispersion composition used is determined and used for evaluation as a mechanical stability index. The mechanical stability index is preferably not higher than 0.65% by mass.

The polytetrafluoroethylene [PTFE] resin film obtained by applying the PTFE-containing aqueous dispersion composition of the invention to an article to be coated also constitutes an aspect of the present invention.

The article to be coated is not particularly restricted but includes, among others, various metals, enamelware, glassware, various ceramics and various thermostable resin moldings. The article to be coated may have any shape or form. Generally, the coating can be carried out by applying the PTFE-containing aqueous dispersion composition of the invention to the substrate, followed by drying and then by baking. While the PTFE-containing aqueous dispersion composition of the invention may be applied directly to the substrate, it is also possible to provide the substrate with a primer layer and then apply the composition onto the primer layer to form a topcoat layer so that the adhesion to the substrate may be improved.

The method for carrying out the above-mentioned application is not particularly restricted but the application can be carried out in the conventional manner of application, for example by dipping, spraying, roll coating, doctor blade coating or flow coating.

The drying conditions can be properly selected according to the hydrocarbon-derived nonionic compound (B) and water-soluble high-molecular compound (C) and so forth. Preferably, the drying is carried out at a temperature from room temperature to 150° C., preferably at 80 to 150° C., for 5 to 20 minutes.

The baking can be carried out generally at a temperature not lower than the fusion temperature of the PTFE resin (A) used, usually at 340 to 415° C. for 5 to 60 minutes, preferably at 360 to 400° C. for 10 to 30 minutes.

The PTFE resin film of the invention may be peeled off from the substrate after baking depending on the substrate species used or may be allowed to remain in contact with the substrate either directly or via a primer layer, for instance.

The PTFE resin film of the invention is formed by application of the PTFE-containing aqueous dispersion composition of the invention.

The PTFE resin film generally has a thickness of not less than 5 µm, preferably about 10 to 100 µm.

The PTFE resin film of the invention can be obtained without any particular restriction provided that the article to be coated is not substantially deteriorated in the step of baking. Thus, for example, the film can serve as a covering material for metal-made cooking utensils, bearings, valves, electric wires, metal foils, boilers, pipes, ship hulls, oven linings, iron bottoms, ice-making trays, snow shovels, plows, chutes, conveyors, rolls, molds, dies, saws, files, drills, other tools, kitchen knives, scissors, hoppers, other containers for industrial use (in particular for use in the semiconductor industry), casting molds and so forth.

The PTFE resin film of the invention can suitably be used in particular as a covering material for high-frequency printed circuit boards, conveyor belts and packing materials, for instance.

The polytetrafluoroethylene [PTFE] resin-impregnated article comprising an article to be impregnated and a coat film obtained by impregnating that article with the PTFE-containing aqueous dispersion composition of the invention also constitutes a further aspect of the present invention.

The article to be impregnated is not particularly restricted but may be, for example, a fibrous substrate, a woven or nonwoven fabric or the like. The fibrous substrate is not particularly restricted but includes, among others, glass fibers, carbon fibers, and aramid fibers (Kevlar (registered trademark) fibers etc.). The impregnation can be carried out in the conventional manner.

The above-mentioned coat film or layer is one made by impregnation of the above-mentioned PTFE-containing aqueous dispersion composition of the invention and generally has a thickness of about 10 to 100 µm according to the shape and/or thickness of the substrate.

Effects of the Invention

The PTFE-containing aqueous dispersion composition of the invention, which has the constitution described hereinabove, is excellent in mechanical stability, so that the formation of PTFE resin agglomerates during the transfer and/or processing of the composition can be markedly reduced.

The PTFE resin film of the invention, which has the constitution described hereinabove, is free of foreign matters or other defects and it is easy to obtain the same as a uniform coat film.

The PTFE resin-impregnated article of the invention, which has the constitution described hereinabove, is free of foreign matters or other defects and it is easy to obtain the same having a uniform coat film.

BEST MODES FOR CARRYING OUT THE INVENTION

The following examples and comparative examples illustrate the present invention in further detail. These examples and comparative examples are, however, by no means limitative of the scope of the invention.

The measurements made in each example or comparative example were carried out by the methods described below.

(1) Average Particle Diameter

A working curve was constructed which shows the relation between the transmittance of incident light rays having a wavelength of 550 nm per unit length of the PTFE-containing aqueous dispersion adjusted to a resin solid concentration of 0.22% by mass and the average particle diameter determined by particle diameter measurements in a certain specific direction on a transmission electron photomicrograph, and the average particle diameter of a sample was determined, using the working curve, from the transmittance as measured in the above manner.

(2) PTFE Resin (A) Concentration

The concentration was determined as the percentage proportion of the mass of the residue obtained by drying 10 g of the PTFE-containing aqueous dispersion composition at a temperature of 380° C. for 45 minutes to the mass of the PTFE-containing aqueous dispersion composition before drying.

(3) Concentration of the Hydrocarbon-Derived Nonionic Compound (B) in the PTFE-Containing Aqueous Dispersion Composition The concentration was determined as the mass per 100 parts by mass of the PTFE resin (A) from the concentration of the PTFE resin (A) determined as described above under (2) and the amount of (B) used on the occasion of preparing the PTFE-containing aqueous dispersion composition of the invention (inclusive of the amount thereof used on the occasion of preparing the PTFE-containing aqueous dispersion, if incorporated on that occasion).

(4) Concentration of the Water-Soluble High-Molecular Compound (C) in the PTFE-Containing Aqueous Dispersion Composition The concentration was determined as the mass per 100 parts by mass of the PTFE resin (A) from the concentration of the PTFE resin (A) determined as described above under (2) and the amount of (C) used on the occasion of preparing the PTFE-containing aqueous dispersion composition of the invention.

(5) Viscosity

Viscosity measurements were carried out at 25° C. according to JIS K 6893 using a type B rotational viscometer (product of Tokyo Keiki Co., Ltd.).

(6) Mechanical Stability Index

A 100-ml portion of the PTFE-containing aqueous dispersion composition to be tested was maintained at 35° C. and circulated using a diaphragm pump connected with a poly(vinyl chloride) tube with an inside diameter of 8 mm and an outside diameter of 11 mm at a rate of 1500 ml/minute for 20 minutes and then filtered through a 200-mesh SUS stainless steel screen. The oversize fraction was weighed, and the proportion (% by mass) thereof to the PTFE resin (A) contained in the PTFE-containing aqueous dispersion composition used was determined for use as the mechanical stability index.

Preparation Example 1

A PTFE-containing aqueous dispersion with a PTFE resin (A) concentration [P.C.] of 30.2% by mass and an average particle diameter of 325 nm was obtained as a PTFE resin (A) by emulsion polymerization.

To the PTFE-containing aqueous dispersion obtained was added a polyoxyethylene alkyl ether (trademark Noigen TDS-80, product of Daiichi Kogyo Seiyaku; average HLB=13) as a hydrocarbon-derived nonionic compound (B), and the mixture was allowed to stand at 70° C. for 8 hours for concentration. Thus was obtained a PTFE-containing aqueous dispersion concentrate with a P.C. of 69.5% by mass, a hydrocarbon-derived nonionic compound (B) concentration [N.C.] of 2.9 parts by mass per 100 parts by mass of the PTFE resin (A).

Preparation Example 2

A PTFE-containing aqueous dispersion with a PTFE resin (A) concentration [P.C.] of 30.2% by mass and an average particle diameter of 325 nm was obtained as a PTFE resin (A) by emulsion polymerization.

To the PTFE-containing aqueous dispersion obtained was added a polyoxyethylene alkyl ether (trademark Noigen TDS-30, product of Daiichi Kogyo Seiyaku; average HLB=8) as a hydrocarbon-derived nonionic compound (B), and concentration was attempted within a liquid temperature range of 20 to 80° C. It was impossible, however, to raise the concentration to a level above the original concentration (P.C. 30.2% by mass).

Preparation Example 3

A PTFE-containing aqueous dispersion with a PTFE resin (A) concentration [P.C.] of 30.2% by mass and an average particle diameter of 325 nm was obtained as a PTFE resin (A) by emulsion polymerization.

To the PTFE-containing aqueous dispersion obtained was added a polyoxyethylene alkyl ether (trademark Noigen TDS-200D, product of Daiichi Kogyo Seiyaku; average HLB 16.3) as a hydrocarbon-derived nonionic compound (B), and concentration was attempted within a liquid temperature range of 20 to 80° C. It was impossible, however, to raise the concentration to a level above the original concentration (P.C. 30.2% by mass).

Example 1

To 300 g of the PTFE-containing aqueous dispersion concentrate were added 6.3 g of Noigen TDS-80, 0.1 g of an aqueous polyacrylic acid dispersion (product of Nihon Junyaku Co., Ltd., molecular weight 20,000, resin concentration 30% by mass) as a water-soluble high-molecular compound (C) and 35.5 g of pure water to give a PTFE-containing aqueous dispersion composition with a P.C. of 61.0% by mass, an N.C. of 5.9 parts by mass per 100 parts by mass of the PTFE resin (A) and a water-soluble high-molecular compound (C) content of 0.02 part by mass per 100 parts by mass of the PTFE resin (A).

The PTFE-containing aqueous dispersion composition obtained had a viscosity of $3.50 \times 10^{-2}$ Pa·s and a mechanical stability index of 0.59% by mass.

Example 2

To 300 g of the PTFE-containing aqueous dispersion concentrate were added 6.3 g of Noigen TDS-80, 0.04 g of an aqueous polyacrylic acid dispersion (product of Nihon Junyaku Co., Ltd., molecular weight 1,000,000, resin concentration 5% by mass) as a water-soluble high-molecular compound (C) and 35.5 g of pure water to give a PTFE-containing aqueous dispersion composition with a P.C. of 61.0% by mass, an N.C. of 5.9 parts by mass per 100 parts by mass of the PTFE resin (A) and a water-soluble high-molecular compound (C) content of 0.001 part by mass per 100 parts by mass of the PTFE resin (A).

The PTFE-containing aqueous dispersion composition obtained had a viscosity of $3.80 \times 10^{-2}$ Pa·s and a mechanical stability index of 0.49% by mass.

Example 3

To 300 g of the PTFE-containing aqueous dispersion concentrate were added 6.3 g of Noigen TDS-80, 0.4 g of an aqueous polyacrylic acid dispersion (product of Nihon Junyaku Co., Ltd., molecular weight 1,000,000, resin concentration 5% by mass) as a water-soluble high-molecular compound (C) and 35.5 g of pure water to give a PTFE-containing aqueous dispersion composition with a P.C. of 60.9% by mass, an N.C. of 5.9 parts by mass per 100 parts by mass of the PTFE resin (A), a water-soluble high-molecular compound (C) content of 0.01 part by mass per 100 parts by mass of the PTFE resin (A).

The PTFE-containing aqueous dispersion composition obtained had a viscosity of $4.50 \times 10^{-2}$ Pa·s and a mechanical stability index of 0.40% by mass.

Example 4

To 300 g of the PTFE-containing aqueous dispersion concentrate were added 6.3 g of Noigen TDS-80, 0.2 g of an aqueous sodium polyacrylate dispersion (product of Nihon Junyaku Co., Ltd., molecular weight 1,000,000, resin concentration 10% by mass) as a water-soluble high-molecular compound (C) and 35.5 g of pure water to give a PTFE-containing aqueous dispersion composition with a P.C. of 61.0% by mass, an N.C. of 5.9 parts by mass per 100 parts by mass of the PTFE resin (A) and a water-soluble high-molecular compound (C) content of 0.01 part by mass per 100 parts by mass of the PTFE resin (A).

The PTFE-containing aqueous dispersion composition obtained had a viscosity of $4.35 \times 10^{-2}$ Pa·s and a mechanical stability index of 0.39% by mass.

Example 5

To 300 g of the PTFE-containing aqueous dispersion concentrate were added 6.3 g of Noigen TDS-80, 10.4 g of an aqueous polyacrylamide dispersion (product of Mitsui Chemicals AquaPolymer, Inc., molecular weight 10,000,000, resin concentration 0.4% by mass) as a water-soluble high-molecular compound (C) and 35.5 g of pure water to give a PTFE-containing aqueous dispersion composition with a P.C. of 59.2% by mass, an N.C. of 5.9 parts by mass per 100 parts by mass of the PTFE resin (A) and a water-soluble high-molecular compound (C) content of 0.02 part by mass per 100 parts by mass of the PTFE resin (A).

The PTFE-containing aqueous dispersion composition obtained had a viscosity of $3.75 \times 10^{-2}$ Pa·s and a mechanical stability index of 0.52% by mass.

Example 6

To 300 g of the PTFE-containing aqueous dispersion concentrate were added 6.3 g of Noigen TDS-80, 7.0 g of an aqueous polyvinylpyrrolidone dispersion (product of Nippon Shokubai Co., Ltd., molecular weight 100,000, resin concentration 30% by mass) as a water-soluble high-molecular compound (C) and 35.5 g of pure water to give a PTFE-containing aqueous dispersion composition with a P.C. of 59.8% by mass, an N.C. of 5.9 parts by mass per 100 parts by mass of the PTFE resin (A) and a water-soluble high-molecular compound (C) content of 1.0 part by mass per 100 parts by mass of the PTFE resin (A).

The PTFE-containing aqueous dispersion composition obtained had a viscosity of $3.70 \times 10^{-2}$ Pa·s and a mechanical stability index of 0.55% by mass.

Example 7

To 300 g of the PTFE-containing aqueous dispersion concentrate were added 6.3 g of Noigen TDS-80, 2.1 g of an aqueous polyvinylpyrrolidone dispersion (product of Nippon Shokubai Co., Ltd., molecular weight 1,100,000, resin concentration 20% by mass) as a water-soluble high-molecular compound (C) and 35.5 g of pure water to give a PTFE-containing aqueous dispersion composition with a P.C. of 60.6% by mass, an N.C. of 5.9 parts by mass per 100 parts by mass of the PTFE resin (A) and a water-soluble high-molecular compound (C) content of 0.2 part by mass per 100 parts by mass of the PTFE resin (A).

The PTFE-containing aqueous dispersion composition obtained had a viscosity of $3.15 \times 10^{-2}$ Pa·s and a mechanical stability index of 0.33% by mass.

Example 8

To 300 g of the PTFE-containing aqueous dispersion concentrate were added 6.3 g of Noigen TDS-80, 5.2 g of an aqueous polyvinylpyrrolidone dispersion (product of Nippon Shokubai Co., Ltd., molecular weight 1,100,000, resin concentration 20% by mass) as a water-soluble high-molecular compound (C) and 35.5 g of pure water to give a PTFE-containing aqueous dispersion composition with a P.C. of 60.1% by mass, an N.C. of 5.9 parts by mass per 100 parts by mass of the PTFE resin (A) and a water-soluble high-molecular compound (C) content of 0.5 part by mass per 100 parts by mass of the PTFE resin (A).

The PTFE-containing aqueous dispersion composition obtained had a viscosity of $4.30 \times 10^{-2}$ Pa·s and a mechanical stability index of 0.53% by mass.

Example 9

To 300 g of the PTFE-containing aqueous dispersion concentrate were added 6.3 g of Noigen TDS-80, 10.4 g of an aqueous poly(vinyl alcohol) dispersion (product of Nippon Sakubi-Poval Kabushiki Kaisha, degree of polymerization 500, degree of hydrolysis 88%, resin concentration 10% by mass) as a water-soluble high-molecular compound (C) and 35.5 g of pure water to give a PTFE-containing aqueous dispersion composition with a P.C. of 59.2% by mass, an N.C. of 5.9 parts by mass per 100 parts by mass of the PTFE resin (A) and a water-soluble high-molecular compound (C) content of 0.5 part by mass per 100 parts by mass of the PTFE resin (A).

The PTFE-containing aqueous dispersion composition obtained had a viscosity of $2.60 \times 10^{-2}$ Pa·s and a mechanical stability index of 0.63% by mass.

Example 10

To 300 g of the PTFE-containing aqueous dispersion concentrate were added 6.3 g of Noigen TDS-80, 2.1 g of an aqueous poly(vinyl alcohol) dispersion (product of Nippon Sakubi-Poval Kabushiki Kaisha, degree of polymerization 3000, degree of hydrolysis 88%, resin concentration 10% by mass) as a water-soluble high-molecular compound (C) and 35.5 g of pure water to give a PTFE-containing aqueous dispersion composition with a P.C. of 60.6% by mass, an N.C. of 5.9 parts by mass per 100 parts by mass of the PTFE resin (A) and a water-soluble high-molecular compound (C) content of 0.1 part by mass per 100 parts by mass of the PTFE resin (A).

The PTFE-containing aqueous dispersion composition obtained had a viscosity of $2.40 \times 10^{-2}$ Pa·s and a mechanical stability index of 0.53% by mass.

Example 11

To 300 g of the PTFE-containing aqueous dispersion concentrate were added 6.3 g of Noigen TDS-80, 4.2 g of an aqueous poly(vinyl alcohol) dispersion (product of Nippon Sakubi-Poval Kabushiki Kaisha, degree of polymerization 3000, degree of hydrolysis 88%, resin concentration 10% by mass) as a water-soluble high-molecular compound (C) and 35.5 g of pure water to give a PTFE-containing aqueous dispersion composition with a P.C. of 60.3% by mass, an N.C. of 5.9 parts by mass per 100 parts by mass of the PTFE resin (A) and a water-soluble high-molecular compound (C) content of 0.2 part by mass per 100 parts by mass of the PTFE resin (A).

The PTFE-containing aqueous dispersion composition obtained had a viscosity of $2.80 \times 10^{-2}$ Pa·s and a mechanical stability index of 0.41% by mass.

Example 12

An impregnated article was formed by impregnating a glass fiber cloth with the PTFE-containing aqueous dispersion composition prepared in Example 3, followed by baking. The glass fiber cloth used had a thickness of 50 μm and a width of 30 cm and was moved at a rate of 1.2 m/minute. During impregnation, the composition was maintained at 25° C., the baking temperature was 380° C. and the baking time was 40 seconds.

An impregnated article having a coat layer thickness of 10 μm and a length of 150 m was formed by carrying the above impregnation and baking for 125 minutes. No foreign matter was observed thereon.

Noigen TDS-80C, when heated at 350° C. for 5 minutes, gave a solid residue percentage of 4% by mass, and the impregnated article formed showed no discoloration.

Example 13

To the PTFE-containing aqueous dispersion composition prepared in Example 7 was added FS Antifoam 013A (product of Dow Corning Asia Ltd.), a silicone emulsion type antifoaming agent, at a level of 0.1% by mass relative to the PTFE-containing aqueous dispersion composition.

The PTFE-containing aqueous dispersion composition obtained had a viscosity of $3.30 \times 10^{-2}$ Pa·s and a mechanical stability index of 0.35% by mass.

Example 14

An impregnated article was formed in the same manner as in Example 12 except that the PTFE-containing aqueous dispersion composition prepared in Example 7 or Example 13 was used in lieu of the PTFE-containing aqueous dispersion composition prepared in Example 3. In either case, no foreign matter was observed. The aqueous dispersion composition of Example 13 as obtained by adding the antifoaming agent foamed less and showed better processability on the occasion of forming impregnated articles as compared with the aqueous dispersion compositions prepared in Example 3 and Example 7.

Example 15

The PTFE-containing aqueous dispersion compositions prepared in Example 7 and Example 13 were subjected to foam testing using an apparatus (shown in FIG. 1) as described in the synthetic detergent testing methods (6.5 foaming power and foam stability) prescribed in JIS K 3362-1990 (application of the Ross Miles test).

A 50-ml portion of each PTFE-containing aqueous dispersion composition was placed, as the sample, in the apparatus in advance, 200 ml of the same PTFE-containing aqueous dispersion composition was poured into a pipette disposed so that the tip thereof might be positioned at a height of 90 cm from the water surface, and the PTFE-containing aqueous dispersion composition was allowed to drop. The resulting foam height was measured at 10-minute intervals just after the start of dropping until 60 minutes after completion of the dropping. The results thus obtained are shown in Table 1.

TABLE 1

| | Foam height (mm) | | | | | | |
|---|---|---|---|---|---|---|---|
| | Just after start of dropping | 10 minutes later | 20 minutes later | 30 minutes later | 40 minutes later | 50 minutes later | 60 minutes later |
| Example 7 | 121 | 116 | 96 | 89 | 36 | 26 | 26 |
| Example 13 | 85 | 17 | 13 | 9 | 6 | 3 | 1 |

The results shown in Table 1 revealed that the aqueous dispersion composition of Example 13 as obtained by adding the antifoaming agent is less capable of foaming and excellent in processability.

Comparative Example 1

To 300 g of the PTFE-containing aqueous dispersion concentrate were added 6.3 g of Noigen TDS-80 and 35.5 g of pure water to give a PTFE-containing aqueous dispersion composition with a P.C. of 61.0% by mass and an N.C. of 5.9 parts by mass per 100 parts by mass of the PTFE resin (A).

The PTFE-containing aqueous dispersion composition obtained had a viscosity of $2.70 \times 10^{-2}$ Pa·s and a mechanical stability index of 0.96% by mass.

Comparative Example 2

To 300 g of the PTFE-containing aqueous dispersion concentrate were added 6.3 g of Noigen TDS-80, 5.2 g of an aqueous dispersion of polyethylene oxide (product of Meisei Chemical Works, Ltd., molecular weight 1,000,000, resin concentration 2% by mass) and 35.5 g of pure water to give a PTFE-containing aqueous dispersion composition with a P.C. of 60.1% by mass, an N.C. of 5.9 parts by mass per 100 parts by mass of the PTFE resin (A) and a polyethylene oxide content of 0.05 part by mass per 100 parts by mass of the PTFE resin (A).

The PTFE-containing aqueous dispersion composition obtained had a viscosity of $4.00 \times 10^{-2}$ Pa·s and a mechanical stability index of 0.67% by mass.

Comparative Example 3

An impregnated article was formed by impregnating a glass fiber cloth with the PTFE-containing aqueous dispersion composition prepared in Comparative Example 1, followed by baking. The glass fiber cloth used and the processing conditions were the same as in Example 12. After the lapse of about 40 minutes following the start of impregnation, foreign matters were observed intermittently on the impregnated article.

INDUSTRIAL APPLICABILITY

The PTFE-containing aqueous dispersion composition of the invention, which has the constitution described hereinabove, is excellent in mechanical stability, so that the formation of PTFE resin agglomerates during the transfer and/or processing of the composition can be markedly reduced.

The PTFE resin film of the invention, which has the constitution described hereinabove, is free of foreign matters or other defects and it is easy to obtain the same as a uniform coat film.

The PTFE resin-impregnated article of the invention, which has the constitution described hereinabove, is free of foreign matters or other defects and it is easy to obtain the same having a uniform coat film.

Figure 1:
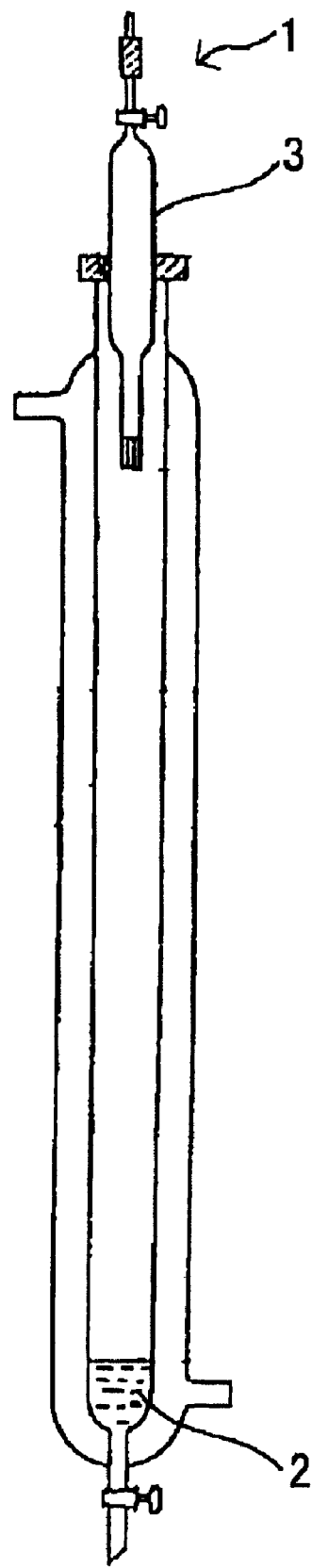
FIG. 1 is a schematic representation of the experimental apparatus used in the foam test in Example 15.

| EXPLANATION OF SYMBOLS | |
|---|---|
| 1 | Foaming power measuring apparatus |
| 2 | Sample (50 ml) |
| 3 | Pipette |

The invention claimed is:

1. A polytetrafluoroethylene-containing aqueous dispersion composition comprising:
   a polytetrafluoroethylene resin (A), a hydrocarbon-derived nonionic compound (B) and a water-soluble high-molecular compound (C) having no oxygen atom in the main chain thereof,
   said water-soluble high-molecular compound (C) is polyvinylpyrrolidone,
   said polyvinylpyrrolidone has an average molecular weight of 100,000 to 20,000,000,
   said composition has a viscosity at 25° C. of not higher than 0.1 Pa·s,
   the content of the water-soluble high-molecular compound (C) is 0.00001 to 0.2 parts by mass per 100 parts by mass of said polytetrafluoroethylene resin (A).

2. The polytetrafluoroethylene-containing aqueous dispersion composition according to claim 1,
   wherein the content of the polytetrafluoroethylene resin (A) is 30 to 70% by mass of the polytetrafluoroethylene-containing aqueous dispersion composition,
   the content of the hydrocarbon-derived nonionic compound (B) is 2 to 12 parts by mass per 100 parts by mass of said polytetrafluoroethylene resin (A) and
   the content of the water-soluble high-molecular compound (C) is 0.00001 to 0.2 part by mass per 100 parts by mass of said polytetrafluoroethylene resin (A).

3. The polytetrafluoroethylene-containing aqueous dispersion composition according to claim 1,
   wherein the polytetrafluoroethylene resin (A) particles have an average particle diameter of 200 to 500 nm.

4. A polytetrafluoroethylene resin film obtained by applying the polytetrafluoroethylene-containing aqueous dispersion composition according to claim 1 to an article to be coated.

5. A polytetrafluoroethylene resin-impregnated article comprising
   an article to be impregnated and a coat film obtained by impregnating said article to be impregnated with the polytetrafluoroethylene-containing aqueous dispersion composition according to claim 1.

* * * * *